United States Patent [19]

Paget

[11] 4,095,175
[45] June 13, 1978

[54] ARC DISCHARGE LAMP BALLAST TESTER

[75] Inventor: Fredrick W. Paget, Rockport, Mass.

[73] Assignee: GTE Sylvania Incorporated, Danvers, Mass.

[21] Appl. No.: 780,737

[22] Filed: Mar. 24, 1977

[51] Int. Cl.² ............................................. G01R 27/00
[52] U.S. Cl. .................................................. 324/57 R
[58] Field of Search ................. 324/57 R; 340/378 R, 340/248 P

[56] References Cited

U.S. PATENT DOCUMENTS

| | | | |
|---|---|---|---|
| 2,225,346 | 12/1940 | Pierre | 324/57 R X |
| 2,302,230 | 11/1942 | Livingston | 324/57 R |
| 2,604,511 | 7/1952 | Marzolf | 324/57 R |
| 2,685,063 | 7/1954 | Alsberg | 324/57 R X |
| 2,970,303 | 1/1961 | Williams | 340/248 P |

Primary Examiner—Stanley T. Krawczewicz
Attorney, Agent, or Firm—James Theodosopoulos

[57] ABSTRACT

A ballast tester contains a DC detector, a peak voltage detector and a third harmonic detector. The DC detector determines if the ballast being tested can produce a steady DC current and is, therefore, a lag ballast. The peak voltage detector can identify the ballast as a lead ballast, while the third harmonic detector can determine if a lead ballast contains a starting capacitor.

5 Claims, 1 Drawing Figure

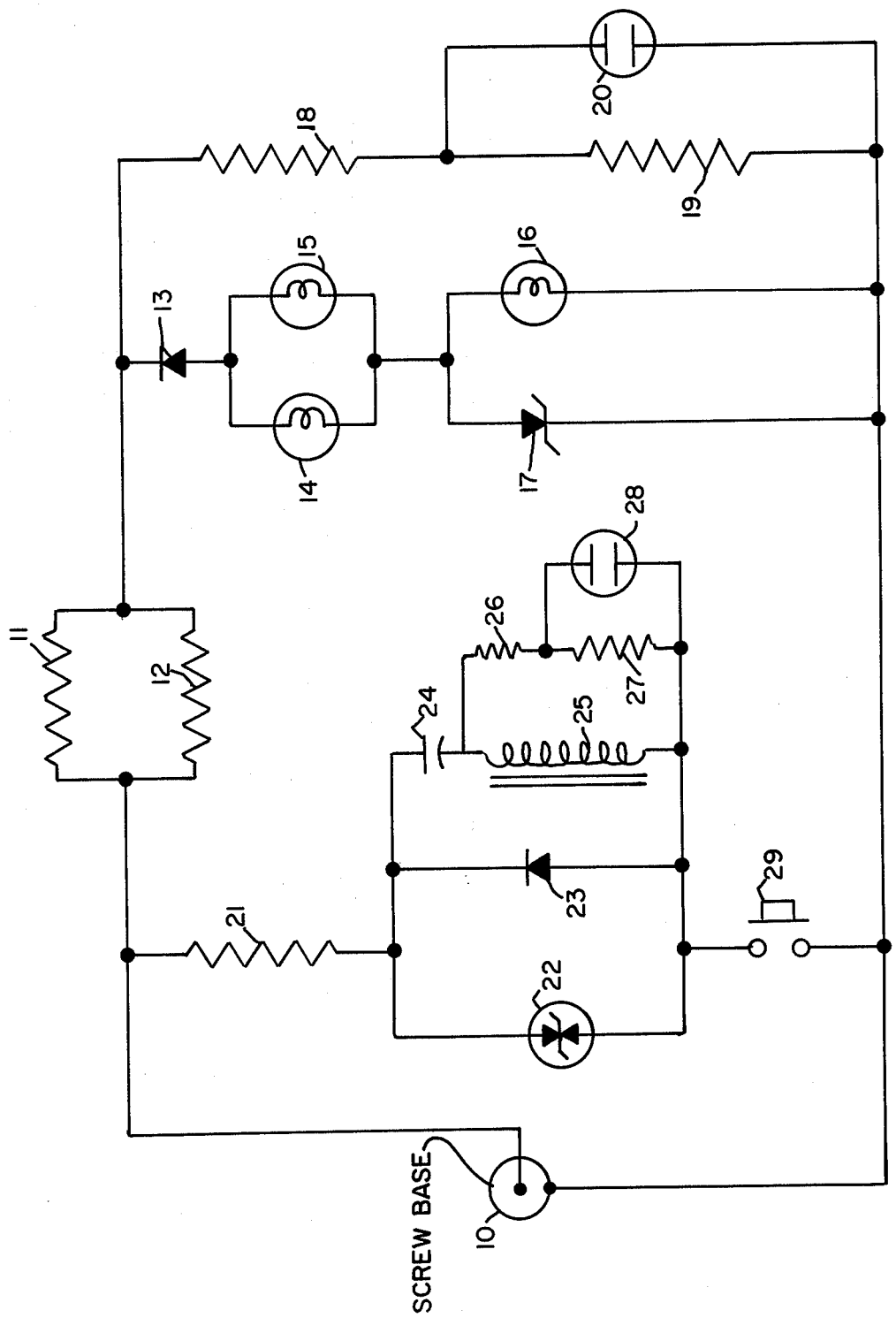

ARC DISCHARGE LAMP BALLAST TESTER

THE INVENTION

This invention concerns a device for testing an arc discharge lamp ballast to determine whether it is a lag (reactor) ballast or a lead ballast. The device is useful in determining whether particular high pressure mercury vapor (HPMV) arc discharge lamps can be replaced by more efficient metal halide or high pressure sodium (HPS) arc discharge lamps designed to be used with HPMV ballasts. For example, a particular type of HPS lamp, shown for example, in U.S. Pat. No. 3,900,753, can be satisfactorily used with a lag ballast but not with a lead ballast. Or a particular metal halide lamp, shown, for example, in U.S. Pat. No. 3,900,761, can be used with a lead ballast (CW or CWA) provided that the ballast does not have a starting capacitor.

The device contains a first circuit portion that determines if steady direct current can be drawn from the ballast. If so, the ballast is a lag ballast. A second circuit portion in the device is a peak voltage detector. This aids in determining if the ballast is a lead ballast. A third circuit portion in the device is a third harmonic detector. This determines if the lead ballast contains a starting capacitor.

The drawing is a diagram of a ballast-testing circuit in accordance with this invention.

In the drawing, base 10 is a screw type base, mogul, for example, for threading into a HPMV socket and for placing the circuit of this invention across the ballast thereof.

The direct current detector portion of the circuit comprises resistors 11 and 12, diode 13, incandescent indicator lamps 14 and 15, and incandescent lamp 16 in parallel with zener diode 17. If lamp 16 lights steadily when the ballast is electrically energized, it indicates that the ballast is a lag ballast, since the circuit is fed by diode 13 which permits direct current only with lag ballasts. In a lead ballast, the output capacitor thereof will quickly charge up to the peak of the line voltage, causing a momentary glow in lamp 16; but thereafter lamp 16 will extinguish. The reason is that with no AC load on the ballast, the capacitor cannot supply a DC load; therefore, no current flows.

The purpose of resistors 11 and 12 and of lamps 14 and 15, which act as nonlinear resistors, is to reduce the voltage drop across lamp 16. Although one resistor could be used in place of resistors 11 and 12, the two resistors yield improved heat dissipation since in a 480 volt circuit, resistors 11 and 12 get quite hot. The open circuit voltage of the ballast can be from about 200 to about 528 volts RMS. Below about 400 volts, only lamp 16 lights. Above about 400 volts, lamps 14 and 15 will also light. The purpose of zener diode 17 is to protect lamp 16 from overvoltage by shunting part of the current at the higher ballast voltages.

The peak voltage detecting portion of the circuit includes resistors 18 and 19 and neon lamp 20, which form a divider circuit to show the presence of an AC peak voltage greater than about 400 volts. Because of diode 13, the capacitor of a lead ballast charges up to a DC voltage equal to the peak of the ballast open circuit voltage. The AC voltage rides on top of that DC level, giving a peak voltage of twice the open circuit voltage peak. This is enough to light neon lamp 20. Therefore, if neon lamp 20 is lit and incandescent lamp 16 is not, the ballast is of the lead type. Some lag ballasts, for example, a 460 volt Metalarc reactor ballast, have high enough output voltage to light neon lamp 20; but lamps 14, 15 and 16 will also be lit, which shows that the ballast is of the lag type.

The third harmonic detecting portion of the circuit comprises resistor 21, thyristor 22, diode 23, capacitor 24, inductor 25, resistors 26 and 27, neon lamp 28 and push button switch 29. This test makes use of the fact that in a lead ballast (CW or CWA) having a starting capacitor, there is a large third harmonic voltage present in the open circuit voltage. A high pass filter, comprising capacitor 24 and inductor 25, effectively removes the 60 hertz signal but allows the harmonic voltage to pass through to neon lamp 28. If neon lamp 28 lights when switch 29 is closed (incandescent lamp 16 being out and neon lamp 20 being lit), then third harmonics are present and the ballast is a lead type having a starting capacitor. Resistor 21 is a dropping resistor and the purpose of resistors 26 and 27 is to adjust the voltage across neon lamp 28. The purpose of thyristor 22 and diode 23 is to remove the peaks from a lead-picked metal halide ballast voltage which would otherwise cause an erroneous indication in the third harmonic detector. The clipped voltage resembles a 60 hertz sine wave and has too little third harmonic to excite the detector. Thyristor 22 may be replaced by several zener diodes connected in series. The purpose of push button switch 29 is to isolate the third harmonic detector when a lead-lag test is being made in order to prevent interference therewith.

In a particular embodiment, resistors 11 and 12 were each 12 kiloohms, 10 watt cermet resistors. In the DC detector, diode 13 was a one ampere rectifier rated at 800 peak inverse volts, incandescent lamps 14, 15 and 16 were 12ES indicator lamps, and zener diode 17 was type IN4749 rated at 24 volts, 1 watt. In the peak voltage detector, the rating of resistor 18 was 62 kiloohms, 2 watts, that of resistor 19 was 12 kiloohms, 1 watt and neon lamp 20 was type NE2-B. Resistors 18 and 19 could be replaced by a potentiometer.

In the third harmonic detector, resistor 21 was an 8 kiloohm, 5 watt, wirewound resistor, and resistors 26 and 27 had ratings of 47 kiloohms, one-fourth watt and 220 kiloohms, one-fourth watt, respectively. In the filter, which was tuned at about 500 hertz, capacitor 24 was a 0.02 microfarad, 600 volt paper capacitor and inductor 25 was an audio inductor, 4-8 henries, 2-5 milliamperes, U.T.C. type SSO-23. Neon lamp 28 was the same as neon lamp 20, diode 23 was the same as diode 13, and thyristor 22 was a 420 volt, metal oxide varistor, GE type V429LB40A.

The ballast tester may be packaged in a suitable tubular plastic container having a metal mogul screw base at one end and a plastic cover at the other end. Push button 29 extends through the cover and indicator lamps 16, 20 and 28 also extend through the cover or at least are externally visible. Lamps 14 and 15 may also be externally visible, if desired. It would also be desirable to mount resistors 11, 12 and 21 in the metal base to aid in heat dissipation.

I claim:

1. An arc discharge lamp ballast tester comprising first circuit means for detecting steady DC current in the output of the ballast, second circuit means for determining if the peak voltage output of the ballast is greater than about 400 volts, third circuit means for detecting third harmonics in the output voltage of the ballast, and means to connect the tester to an arc discharge lamp ballast.

2. The ballast tester of claim 1 wherein said first circuit means includes an indicator lamp that is activated by said DC current.

3. The ballast tester of claim 1 wherein said second circuit means includes a neon lamp that is energized when the ballast being tested is a lead ballast.

4. The ballast tester of claim 1 wherein a switch is in series with the third circuit means in order to isolate the third harmonic detector when the switch is open.

5. The ballast tester of claim 1 wherein said means to connect the tester to a ballast comprises a mogul screw base.

* * * * *